(12) United States Patent
Fujii

(10) Patent No.: US 8,133,365 B2
(45) Date of Patent: Mar. 13, 2012

(54) METHOD OF ARC ION PLATING AND TARGET FOR USE THEREIN

(75) Inventor: Hirofumi Fujii, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 711 days.

(21) Appl. No.: 12/279,555

(22) PCT Filed: Mar. 6, 2007

(86) PCT No.: PCT/JP2007/054286
§ 371 (c)(1),
(2), (4) Date: Aug. 15, 2008

(87) PCT Pub. No.: WO2007/108313
PCT Pub. Date: Sep. 27, 2007

(65) Prior Publication Data
US 2009/0065348 A1    Mar. 12, 2009

(30) Foreign Application Priority Data
Mar. 22, 2006   (JP) .................................. 2006-079255

(51) Int. Cl.
*C23C 14/34* (2006.01)
(52) U.S. Cl. ......... 204/192.38; 204/298.12; 204/298.41; 204/192.11

(58) Field of Classification Search ............. 204/298.41, 204/198.38
See application file for complete search history.

(56) References Cited

U.S. PATENT DOCUMENTS
2004/0055884 A1* 3/2004 Fujii et al. ................ 204/298.41

FOREIGN PATENT DOCUMENTS
| JP | 60 181268 | 9/1985 |
| JP | 60181268 A * | 9/1985 |
| JP | 2003 301266 | 10/2003 |
| JP | 2004 107750 | 4/2004 |

* cited by examiner

*Primary Examiner* — Keith Hendricks
*Assistant Examiner* — Jenny Wu
(74) *Attorney, Agent, or Firm* — Oblon, Spivak, McClelland, Maier & Neustadt, L.L.P.

(57) ABSTRACT

In an arc ion plating method, the target is divided into a central portion and longitudinal end portions at both longitudinal ends of the central portion. A constituent material of the target is evaporated and ionized by vacuum arc discharge using the target as a cathode, wherein the position of an arc spot on a surface of the target is controlled such that the consuming speed of the longitudinal end portions becomes higher than that of the central portion, whereby at least one of the longitudinal end portions will reach its consumption limit before the target central portion reaches its consumption limit. Only the respective longitudinal end portion that has reached its consumption limit is thereafter replaced, and the film forming step is continued.

3 Claims, 9 Drawing Sheets

METHOD OF ARC ION PLATING AND TARGET FOR USE THEREIN

FIELD OF ART

The present invention relates to an arc ion plating method for forming a hard film on cutting tools and mechanical parts (sliding parts) for the improvement of abrasion resistance, as well as a target used in the method.

BACKGROUND ART

Arc ion plating is known as a method for forming a film on a work. In the arc ion plating, vacuum arc discharge is performed in a vacuum atmosphere using a target as a cathode, the target being formed of a material to be evaporated for forming a film. This discharge causes the target material to be evaporated and ionized. The resulting target material ions are conducted to a work and form a film on the work. For forming a hard film of a metal nitride or a metal carbide by the arc ion plating there is performed reactive coating in which a reactive gas is introduced into a vacuum chamber, e.g., such reactive coating as introducing $N_2$ gas to a target formed of Cr to form a CrN film.

As an example of a conventional arc ion plating method there is disclosed in Patent Literature 1 an arc ion plating method (a vacuum arc evaporation method) using a cylindrical rod target whose both longitudinal end portions are formed thicker than its central portion. This conventional arc ion plating method will now be described with reference to FIGS. 7 to 10. FIG. 7 is a schematic configuration diagram of an apparatus for carrying out the conventional arc ion plating method, FIG. 8 is a front view of a rod target shown in FIG. 7, FIG. 9 is a sectional front view of the rod target and FIG. 10 is a diagram for explaining how to produce the rod target.

In FIG. 7, a rod target 52 and a work 53 are disposed within a vacuum chamber 51 in a state in which the respective longitudinal axes are parallel or nearly parallel to each other. The rod target 52 is in the form of a cylinder having intermediate stepped portions and is disposed at the center of the chamber 51 in a upright attitude extending vertically.

A rotary table 55 is disposed in a lower portion of the vacuum chamber 51 and it is supported rotatably about a vertical axis which is approximately coincident with the axis of the rod target 52. The work 53 which extends vertically is placed upright on the rotary table 55 through a holding member 56. With rotation of the rotary table 55, the work 53 rotates around the rod target 52 and also rotates about a vertical axis of the work 53 together with the holding member 56. A magnet 54 is disposed within the rod target 52 in a vertically movable manner.

This apparatus is further provided with an arc power supply 57 having an anode and a cathode. The cathode is connected to an upper end of the rod target 52 and the anode is connected to the vacuum chamber 51. That is, the rod target 52 is set to the cathode and the vacuum chamber 51 is set to the anode.

As shown in FIGS. 8 and 9, the rod target 52 has a shape such that both longitudinal end portions thereof are thicker than its central portion. That is, both longitudinal end portions of the rod target 52 are large-diameter portions (thick portions) 521, 521, while a central portion thereof is a small-diameter portion (thin portion) 522.

For fabricating the rod target 52 there is used HIP treatment wherein the powder of a target material is pressed by HIP (hot isostatic pressing). More particularly, as shown in FIG. 10, the rod target 52 is fabricated by a method comprising a step of forming the large-diameter portions 521, 521 and small-diameter portion 522 each individually into simple cylindrical shapes by the HIP treatment and a step of assembling them so that the large-diameter portions 521, 521 and the small-diameter portion 522 are united.

In this conventional arc ion plating method, the target 52 and the work 53 are disposed in a state in which the respective longitudinal axes are parallel or nearly parallel to each other, and target material ions are conducted to the work 53 by vacuum arc discharge using the target 52 as a cathode to form a film on the surface of the work. As the target 52 there is used one having the large-diameter portions 521, 521 as both longitudinal end portions and the small-diameter portion 522 as a central portion and the position of an arc spot on the target surface is controlled by a vertical movement of the magnet 54. With this control, the formation of a film on the work 53 is promoted while making the consuming speed of the large-diameter portions 521, 521 higher than that of the small-diameter portion 522, thereby making it possible to obtain a uniform film thickness distribution such that variations in film thickness is within ±5% substantially throughout the overall length of the work 53.

If the target consuming speed (target material evaporation quantity) is uniform in the longitudinal direction of the target, the area ensuring a uniform film thickness in the work 53 is limited to the center and the vicinity thereof of the work. Thus, for obtaining a uniform film thickness substantially throughout the overall length of the work it is necessary to increase the consuming speed at both end portions of the target.

Accordingly, in the conventional arc ion plating method in question there is used the rod target 52 whose both longitudinal end portions are formed thicker than its central portion to correspond to the foregoing consuming speed distribution considered necessary for attaining a uniform film thickness. The rod target 52 of such a shape is high in utilization efficiency as compared with a cylindrical target free of stepped portions and there is no waste of the target material.

However, the conventional arc ion plating method described above is disadvantageous in that the production efficiency of the rod target 52 is poor. More particularly, the shape of the rod target 52 is restricted to such a special shape as its both longitudinal end portions being thicker than its central portion. This makes the manufacturing process for the rod target 52 complicated. Besides, a demand exists for a further reduction of the target cost.

Patent Literature 1: Japanese Patent Laid-Open Publication No. 2004-107750 (FIGS. 1 to 3 and 9)
Patent Literature 2: Japanese Patent Laid-Open Publication No. 2003-301266 (FIG. 1)

DISCLOSURE OF THE INVENTION

Accordingly, it is an object of the present invention to provide an arc ion plating method and a target used therein, which are not only capable of obtaining a uniform film thickness distribution substantially throughout the overall length of a work but also capable of improving the yield of the target material and reducing the target manufacturing cost in comparison with the related art.

For achieving the above-mentioned object, in the arc ion plating method according to the present invention there are included a step of disposing a target and a work within a vacuum chamber and a step of evaporating and ionizing the target by vacuum arc discharge to produce target material ions and conducting the target material ions to the work to form a film on the work. In the film forming step, an arc spot position on the target surface is controlled so as to make the consuming speed (evaporation quantity per unit time) of both longitudinal end portions of the target higher than the consuming speed of a central portion of the target. This control makes it possible to obtain a uniform film thickness distribution substantially throughout the overall length of the work.

Further, in the arc ion plating method according to the present invention, as the target there is disposed one whose at least both longitudinal end portions and the other central portion can be divided from each other, and the formation of a film involving changing the consuming speed as referred to above is performed. In this case, until at least the central portion of the target reaches a consumption limit, only both longitudinal end portions higher in consumption speed are replaced. Such a partial replacement makes it possible for the mutually separable components of the target to be all used up to the consumption limit. This permits decreasing the amount of the target material used relative to an effective consumption quantity of the target regardless of shapes of the target and thereby improving the yield of the target material. This makes it possible to reduce the target manufacturing cost and the price of the target and hence reduce the price of the film-formed product obtained.

BEST MODE FOR CARRYING OUT THE INVENTION

Figure 1:
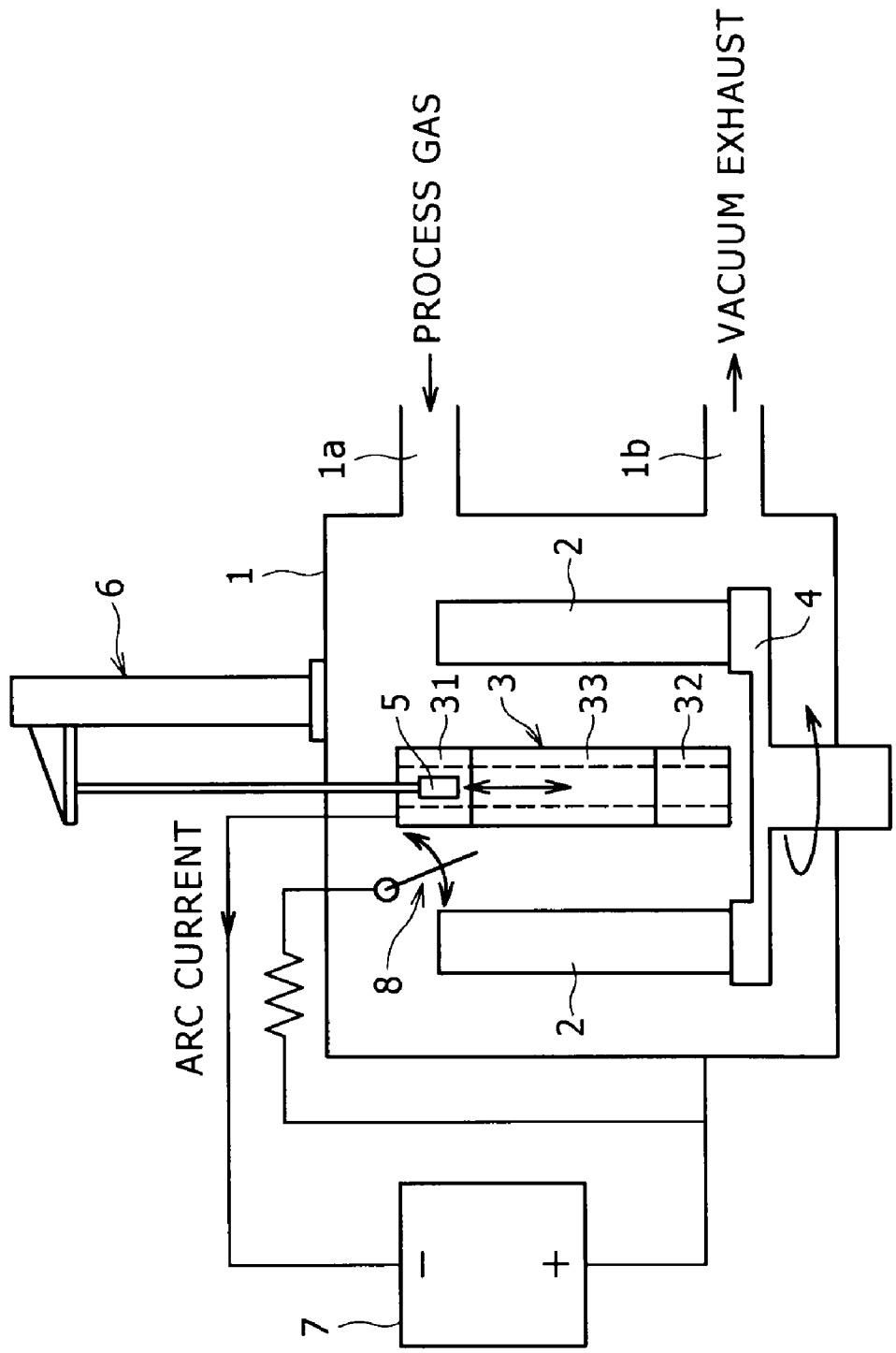
FIG. 1 is a schematic configuration diagram of an arc ion plating apparatus for carrying out an arc ion plating method according to an embodiment of the present invention.

FIG. 1 is a schematic configuration diagram of an arc ion plating apparatus for carrying out an arc ion plating method according to an embodiment of the present invention.

As shown in FIG. 1, this apparatus is provided with a vacuum chamber 1, and a work 2 and a target 3 are disposed within the vacuum chamber 1.

The target 3 is cylindrical and is disposed in a vertically extending upright attitude centrally within the vacuum chamber 1. A rotary table 4 for placing works thereon is disposed at a lower position within the vacuum chamber 1 and plural works 2 are placed on the rotary table 4. In this embodiment, each work 2 is in the shape of a vertically extending cylinder. However, the shape of each work employable in the present invention is not limited to such a cylindrical shape. The works may be a large number of such small articles as cutting tools arranged side by side, or rod- or plate-like ones.

The works 2 each have a longitudinal dimension (height dimension) relatively close to the longitudinal dimension of the target 3. With rotation of the rotary table 4, the works 2 not only rotate around the target 3 but also each rotate about its vertical axis in a state in which their longitudinal axes are parallel or nearly parallel to one another with respect to the target 3. A DC bias supply (not shown) is connected to each work 2 for the supply of a negative bias voltage to the work 2.

A gas inlet 1a for the introduction of process gas and a vacuum exhaust port 1b connected to a vacuum exhaust system are formed in the vacuum chamber 1.

The apparatus is further provided with an arc power supply 7 having a cathode and an anode, the cathode being connected to an upper end-side portion of the target 3 and the anode connected to the vacuum chamber 1. Thus, in this apparatus, the target 3 is set to the cathode of arc potential, while the vacuum chamber 1 is set to the anode. An arc ignition mechanism 8 having a trigger pin is connected to the anode side of the arc power supply 7 through a resistor. Instantaneous contact between the trigger pin and the outer periphery surface of the target 3 induces vacuum arc discharge.

An arc spot (discharge spot) in the vacuum arc discharge runs about on the outer periphery surface of the target 3. To be specific, this apparatus includes a permanent magnet 5 disposed vertically movably within the target 3 and a magnet lift device 6 for moving the permanent magnet 5 vertically. The position of the arc spot on the outer periphery surface of the target 3 is controlled by the vertical movement of the permanent magnet 5. This control permits changing the distribution of the consuming speed (evaporation quantity per unit time) in the longitudinal direction of the target 3. This arc spot position control may be done by any other means than the use of a permanent magnet. For example, it may be done by using an electromagnetic coil.

Figure 2:
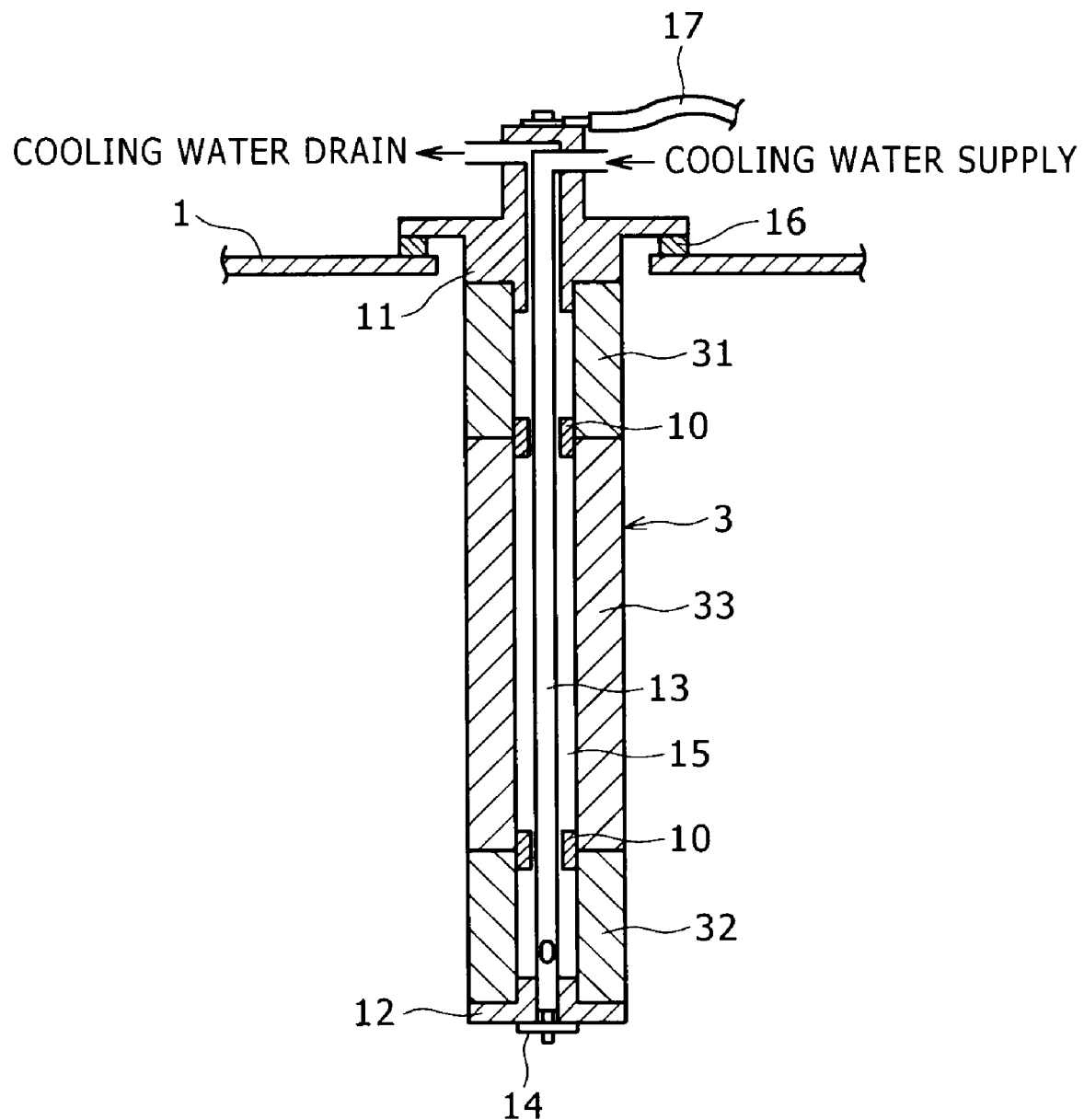
FIG. 2 is a sectional view for explaining a target shown in FIG. 1.

FIG. 2 is a sectional view for explaining the target shown in FIG. 1.

As shown in FIG. 2, the cylindrical target 3 comprises an upper target 31 which constitutes a target upper end portion, a lower target 32 having the same size as the upper target 31 and constituting a target lower end portion, and a central target 33 disposed between the upper and lower targets and constituting a target central portion. The target 3 can be divided into these three portions, which portions are connected together through a pair of connecting rings 10 and are united thereby. That is, the upper and lower targets 31, 32 and the central target 33 are connected together so as to be separable from each other.

On the other hand, an upper flange 11 is mounted through an annular insulating member 16 to a top plate of the vacuum chamber 1 and a bottomed hollow shaft 13 extending vertically is mounted to the upper flange 11, with cooling water being conducted to the interior of the bottomed hollow shaft 13. The outer periphery surface of a lower end portion of the bottomed hollow shaft 13 is externally threaded and a target mounting nut 14 is threaded engaged with the external thread. Further, a lower flange 12 is disposed on the nut 14. The target 3 united by the connecting rings 10 is fitted on the outside of the bottom hollow shaft 13 and is fixed in this state to the upper flange 11 by the lower flange 12 and the nut 14.

The bottomed hollow shaft 13 to which the upper flange 11 is attached serves as both a passage for the supply of cooling water to cool the target 3 and an arc current supply path. Cooling water which is conducted into the bottomed hollow shaft 13 passes through a hole formed in the lower end portion of the bottomed hollow shaft 13 and flows out to a cooling water discharge passage 15 formed within the target 3 and around the shaft 13. The cooling water then flows upward through the interior of the cooling water discharge passage 15 and is discharged from the interior of the target 3. The permanent magnet 5 shown in FIG. 1 (not shown in FIG. 2) is disposed vertically movably within the cooling water discharge passage 15 of the target 3.

A power cable 17 connected to the cathode side of the arc power supply 7 to supply an arc current therein is connected to the upper flange 11.

A description will now be given about the arc ion plating method of this embodiment which is carried out using the arc ion plating apparatus described above.

According to the arc ion plating method of this embodiment, the target 3 and the works 2, which are relatively close to each other in longitudinal dimension, are disposed in a state in which the respective longitudinal axes are parallel or nearly parallel to each other in the vacuum chamber 1. The target 3 is evaporated and ionized by vacuum arc discharge and the resulting target material ions are conducted to the works 2 to form a film on the surface of each work. At the time of this film formation, the arc spot position on the outer periphery surface of the target is controlled by a vertical movement of the permanent magnet 5 along the cooling water discharge passage 15 within the target 3. The consuming speed (evaporation quantity per unit time) of the upper and lower targets 31, 32 is set to a higher speed (e.g., twice higher) than the consuming speed of the central target 33 by making the vertically moving speed of the permanent magnet 5 higher when the arc spot lies on the central target 33 than when the arc spot lies on the upper or lower target 31 (32). The formation of a film on each work 2 which involves such a control makes it possible to obtain a uniform film thickness distribution substantially throughout the overall length of each cylindrical work 2.

The film formation is carried out for plural works 2 per batch. When the film formation is repeated N batches (N is a specific natural number), the upper and lower targets 31, 32 higher in consuming speed than the central target 33 reach the consumption limit earlier than the central target 33. At this time, the targets having reached the consumption limit are replaced with targets not used yet.

The consuming speed of the upper and lower targets 31, 32 is not limited to the speed twice as high as that of the central target 33. For example, it may be another integer multiple speed such as three or four times. The replacement timing of the upper target 31 and that of the lower target 32 need not always be simultaneous. However, if suitable treatment conditions (e.g., consumption limit quantities (wall thicknesses) of the upper and lower targets 31, 32 and that of central target 33, length ratio between the upper, lower targets 31, 32 and the central target 33, the consuming speed of the upper and lower targets 31, 32 and that of the central target 33) are adjusted in such a manner that the replacement timing based on the consumption limit of the central target 33 low in consuming speed and that of the upper and lower targets 31, 32 high in consuming speed and replaced earlier overlap each other, the management of the target becomes easier and the target utilization efficiency is improved.

Figure 3:
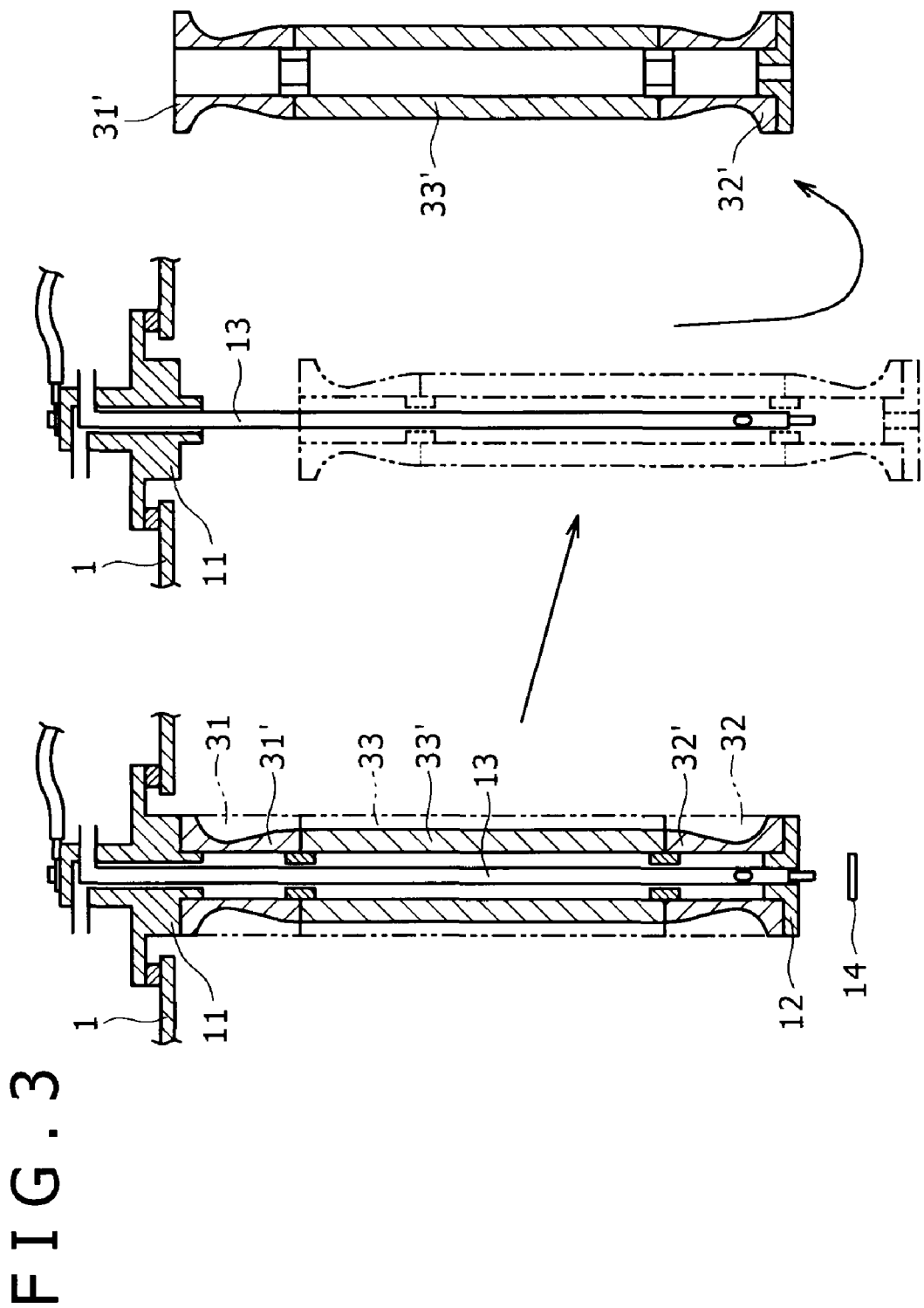
FIG. 3 is a diagram for explaining an example of a target replacing procedure according to the present invention.
Figure 4:
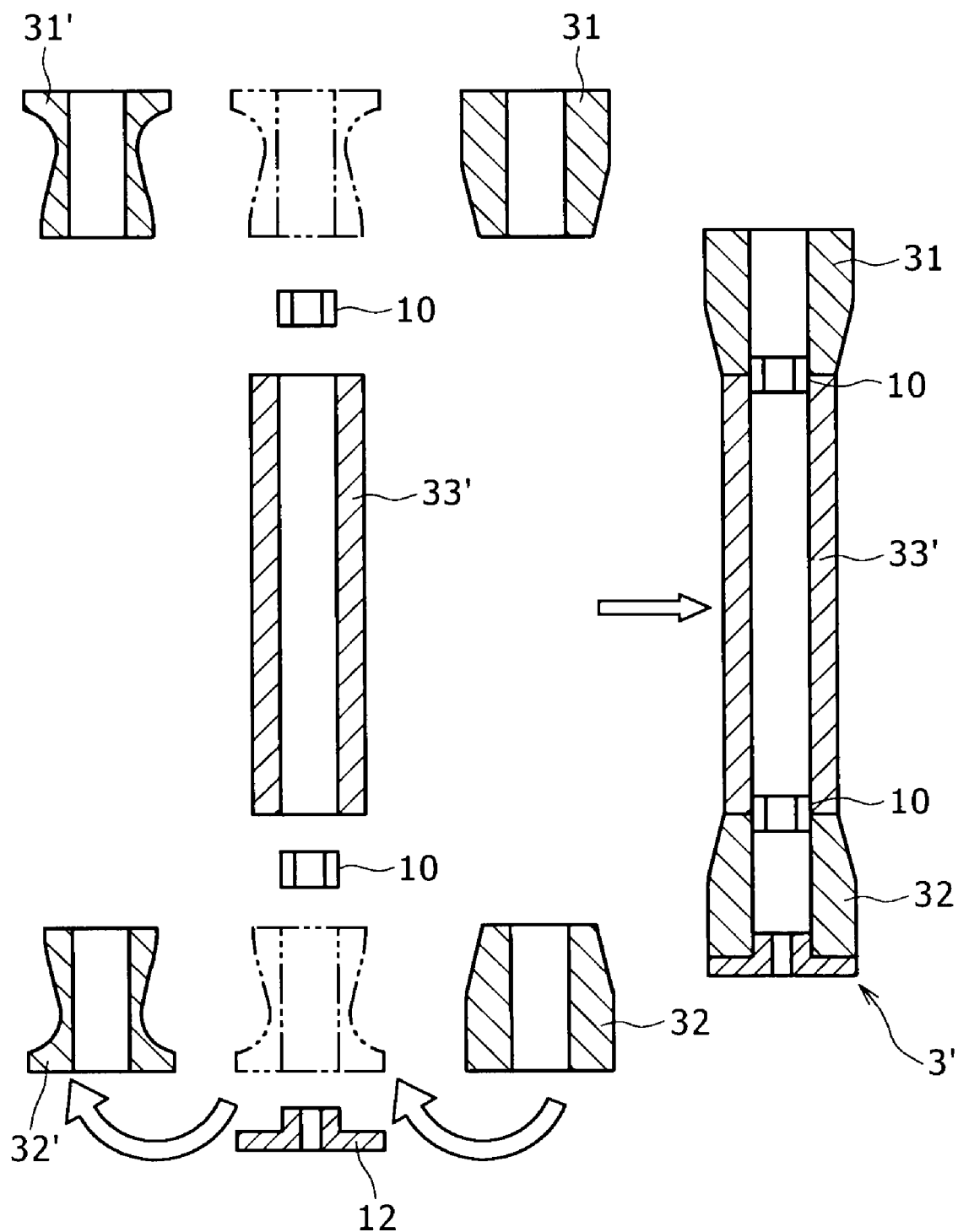
FIG. 4 is a diagram for explaining the target replacing procedure according to the present invention.
Figure 5:
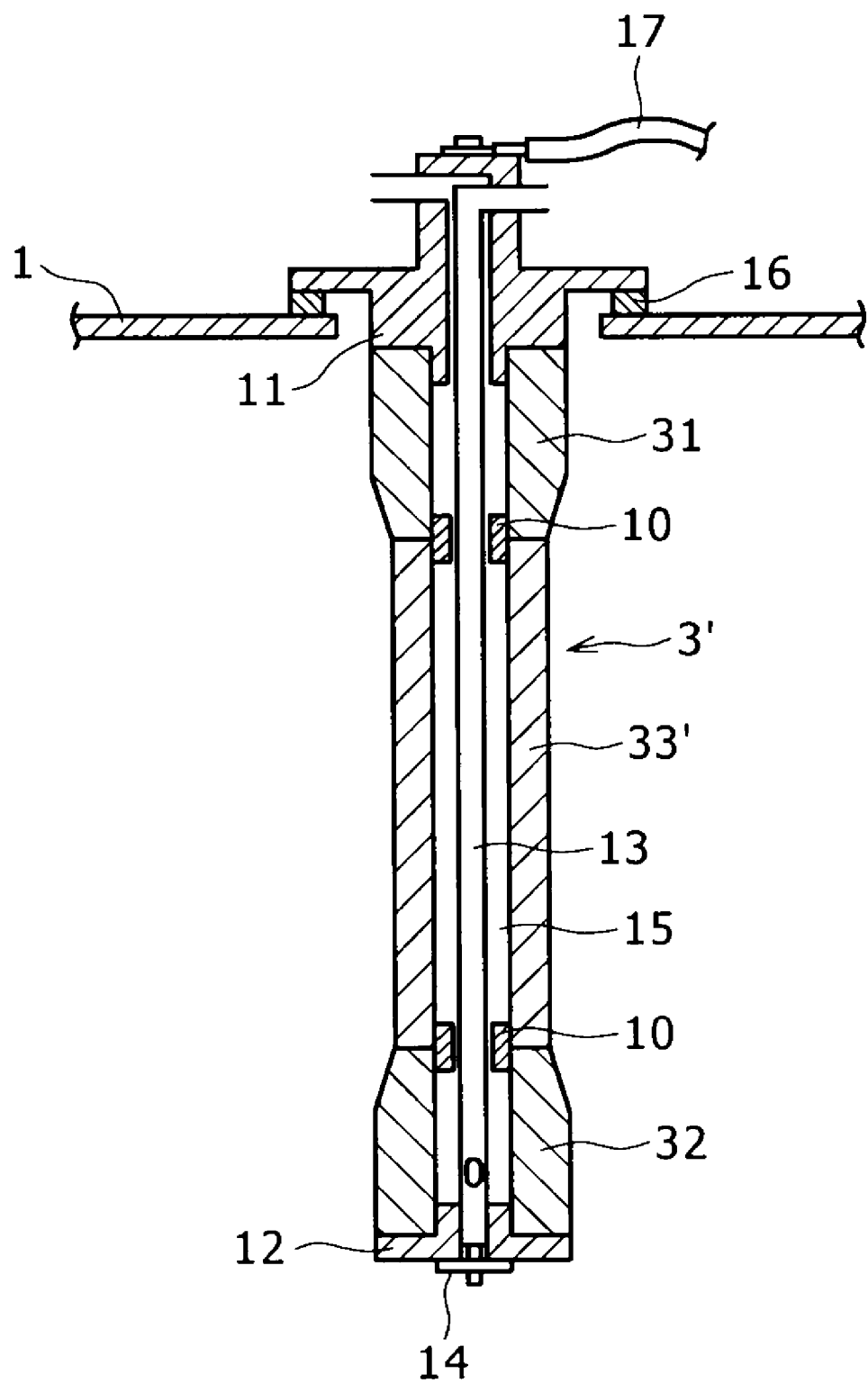
FIG. 5 is a diagram for explaining the target replacing procedure according to the present invention.

FIGS. 3 to 5 are diagrams for explaining a target replacing procedure according to the present invention.

The target comprising the upper target 31' and the lower target 32' having reached the consumption limit by the above N batch treatment and the central target 33' having been consumed by an amount corresponding to the N batches is taken out from the bottomed hollow shaft 13 by removal of the nut 14 from the bottomed hollow shaft 13, as shown in FIG. 3. Thereafter, as shown in FIG. 4, the target is disassembled and, instead of the upper and lower targets 31', 32' having reached the consumption limit, upper and lower targets 31, 32 not used yet (new targets) are connected to the central target 33', whereby a target 3' including the upper and lower targets 31, 32 not used yet is newly formed. As shown in FIG. 5, this target 3' is fixed to the upper flange 11 in a state in which it is fitted on the outside of the bottomed hollow shaft 13.

In the upper target 31, at a position close to the central target 33' (a lower end portion of the upper target 31) there is formed a convergent tapered portion such that the diameter of the upper target 31 at the position of connection between the upper target 31 and the central target 33' and the diameter of the central target 33' is equal to each other. This tapered portion is for positively preventing the extinguishment of an arc spot caused by the difference between the above diameters when the arc spot shifts between the targets 31 and 33'. The formation of the tapered portion is not always required.

Likewise, in the lower target 32, at a position close to the central target 33' (an upper end portion of the lower target 32) there is formed a convergent tapered portion such that the diameter of the lower target 32 at the position of connection between the lower target 32 and the central target 33' and the diameter of the central target 33' are equal to each other. This tapered portion is also for positively preventing the extinguishment of an arc spot caused by the difference between the above diameters while the arc spot shifts between the targets 32 and 33'. The formation of this tapered portion is not always required, either.

Subsequently, the film formation is repeated by the same number of N batches as the last time, whereby upon arrival of the central target 33' at the consumption limit, the upper and lower targets 31, 32 installed by the previous (last time) replacement also reach the consumption limit. At this time point, as shown in FIG. 2, the entire target is replaced by a new target 3 not used yet. As to the frequency of replacement of both longitudinal end portions of the target until replacement of the entire target by a new target, it is not specially limited. For example, both end portions may be replaced twice or three times or more during one replacement of the central portion.

In the method described above, each of the upper and lower targets 31, 32 and central target 33 as dividable components of the target 3 can be used up to the consumption limit, so that it is possible to reduce the amount of the target material used relative to the effective consumption quantity of target and thereby improve the yield of the target material in comparison with the related art disclosed in the foregoing Japanese Patent Laid-Open Publication No. 2004-107750. Besides, the shape of the target is not specially limited. Consequently, for example by setting the shape of the target to a shape such that a sectional shape dimension orthogonal to the longitudinal direction thereof is uniform throughout the overall length of the target, it is possible to reduce the manufacturing cost of the target 3 and hence possible to reduce the cost of the target. This effect is outstanding particularly when forming by HIP is used for the production of the target 3. For example, in the method of using rod targets which are thicker in both longitudinal end portions than the central portion as in the above related art, in case of forming the said rod targets by HIP treatment, it is necessary to provide plural types of target material accommodating capsules different in diameter for the HIP treatment. On the other hand, in case of manufacturing a target which is uniform in diameter throughout the entire longitudinal area, the manufacturing process and equipment are simplified.

In the arc ion plating method according to the present invention, the target central portion (33) may be divided into plural sub-portions where required. This division is effective in the case of a very long target (e.g., in case of an overall target length being 600 mm or more).

In the arc ion plating method according to the present invention, the arc spot position control performed for changing the consuming speed between both longitudinal end portions (31, 32) and the central portion (33) of the target is not limited to the foregoing position control for the permanent magnet 5. The arc spot position control may be done even by any other known method, e.g., an anode position control method or an anode current balance adjusting method.

Figure 6:
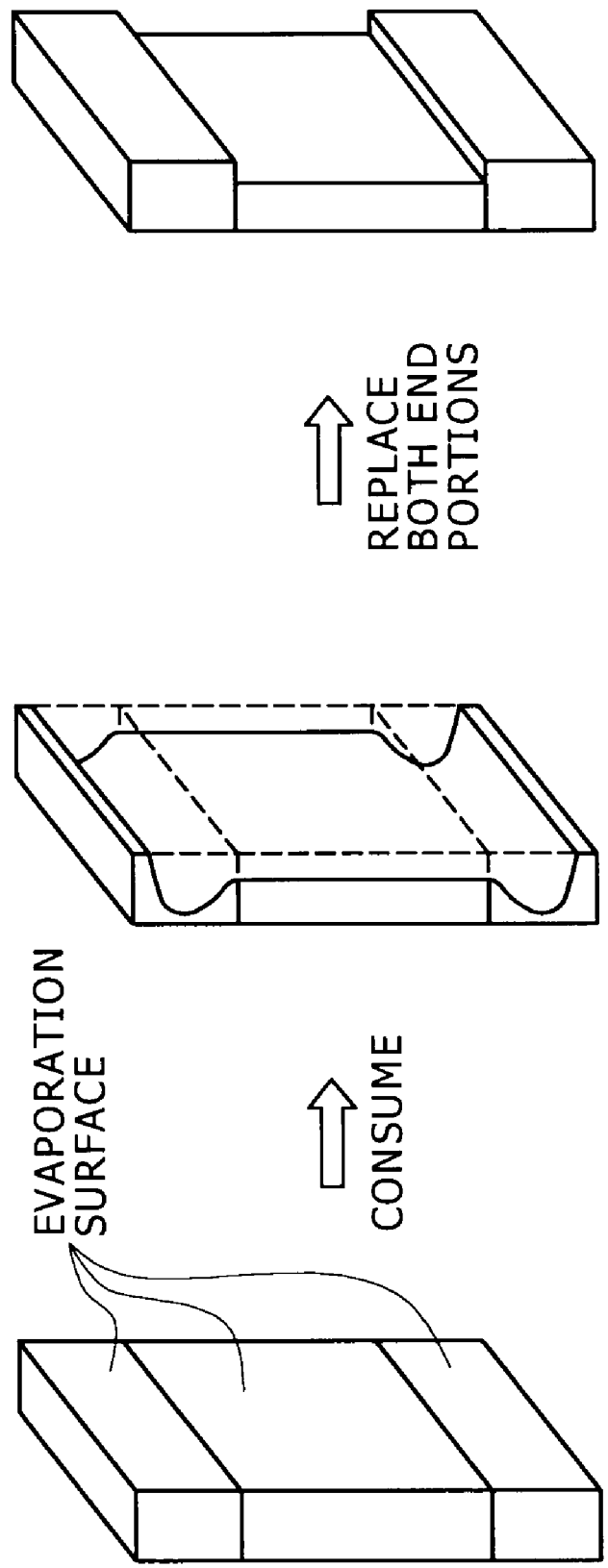
FIG. 6 is a diagram for explaining another example of a target according to the present invention.
Figure 7:
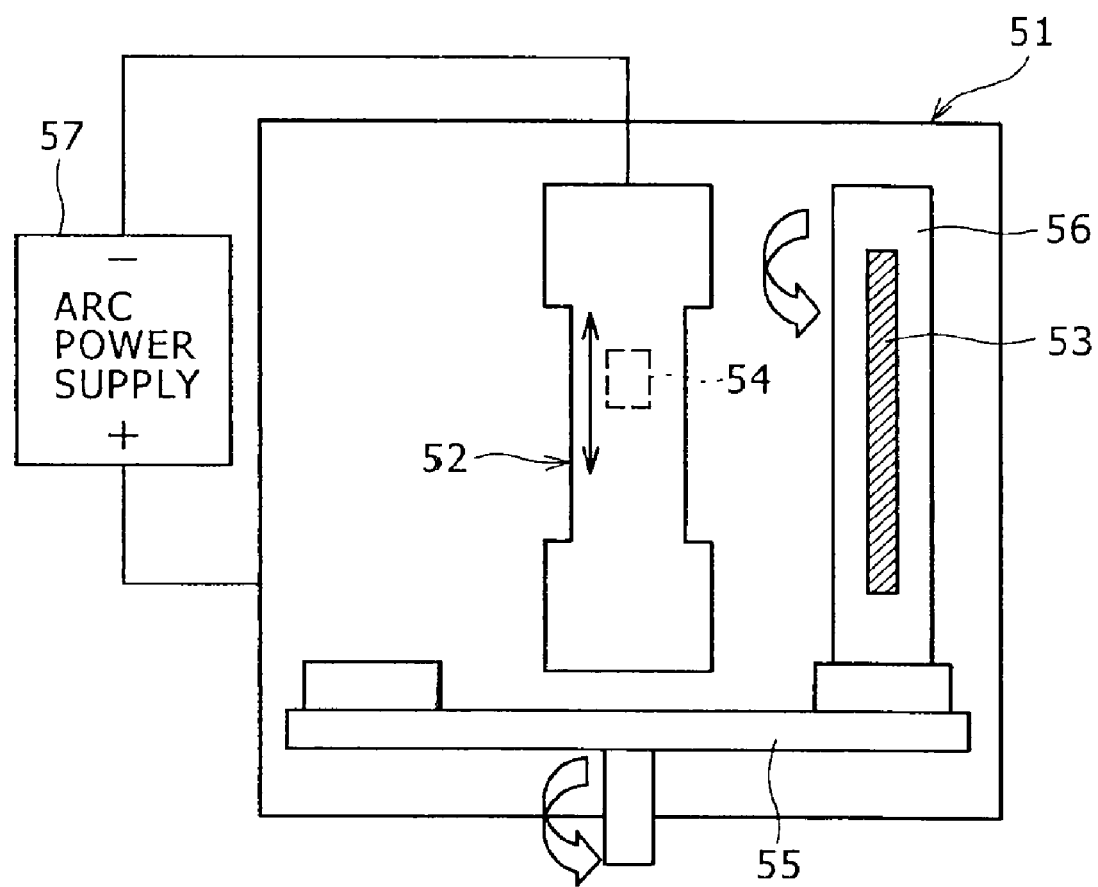
FIG. 7 is a schematic configuration diagram of an apparatus for carrying out a conventional arc ion plating method.
Figure 8:
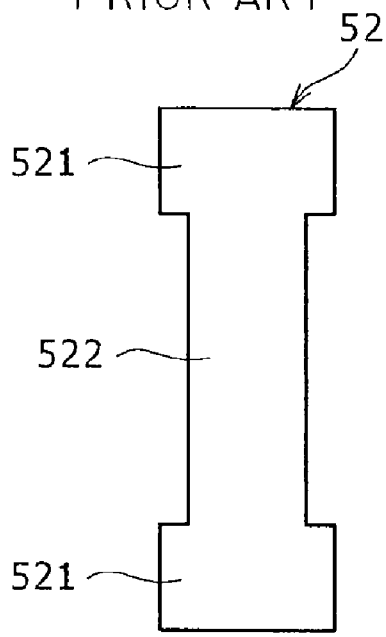
FIG. 8 is a front view of a rod target shown in FIG. 7.
Figure 9:
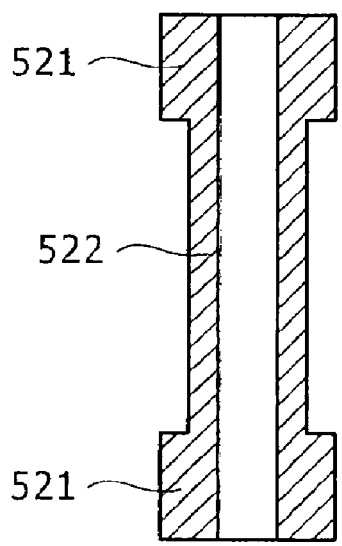
FIG. 9 is a sectional front view of the rod target.
Figure 10:
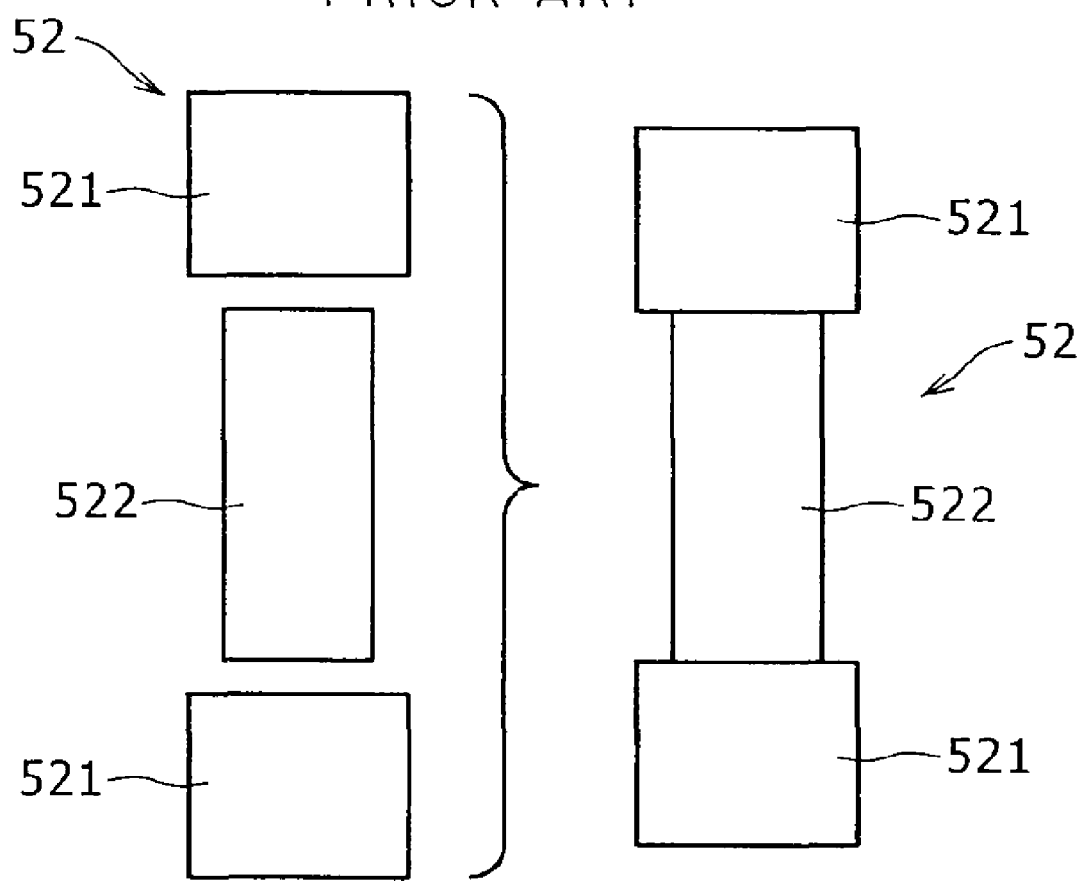
FIG. 10 is a diagram for explaining a rod target fabricating method.

It is no specially limited in what shape the target used in the arc ion plating method of the present invention should be while it is not in use. The shape in question may be not only the foregoing cylindrical shape but also a prismatic shape or such a plate shape as shown in FIG. 6. A sectional shape of the target orthogonal to its longitudinal direction is not limited to the one which is the same throughout the overall length of the target. It may be a shape such that the diameter of each both end portions is somewhat larger than the diameter of the central portion already when the target is not in use.

In the arc ion plating method described above there are included a step of disposing a target and works within the vacuum chamber and a step of evaporating and ionizing the target by vacuum arc discharge to form target material ions and conducting the target material ions to the works, allowing a film to be formed on each of the works. In the film forming step there is performed an arc spot position control for the target surface in such a manner that the consuming speed (evaporation quantity per unit time) of both longitudinal end portions of the target is made higher than the consuming speed of the central portion thereof. This control makes it possible to obtain a uniform film thickness distribution throughout the overall length of each work.

Further, in the arc ion plating method of the present invention, the target is one dividable at least into both longitudinal end portions and a central portion and there is performed film formation involving changing the consuming speed as described above. At this time, until at least the central portion of the target reaches the consumption limit, only both longitudinal end portions high in consuming speed are replaced. Such a partial replacement permits each of the dividable components of the target to be used up to the consumption limit. This, irrespective of the target shape, makes it possible to decrease the amount of the target material used relative to the effective consumption quantity of the target and thereby improve the yield of the target material. This makes it possible to reduce the target manufacturing cost and the price of the target and hence reduce the price of the resulting film-formed product.

In the foregoing target and works disposing step it is preferable that each of the works and the target having substantially the same longitudinal dimension as that of each work be opposed to each other in an attitude such that the longitudinal dimension of each work and that of the target are substantially parallel to each other.

In the foregoing target and works disposing step it is preferable that the target to be disposed be one whose sectional shape dimension in a direction orthogonal to its longitudinal direction is substantially equal throughout the overall length of the target. Such a target is easy to manufacture and it is possible to attain the reduction of its cost.

On the other hand, in the foregoing film forming step, at the time of replacing only both longitudinal end portions of the target while allowing the central portion thereof to remain, the target may be one having both longitudinal end portions which are convergently tapered at the positions of their connections with the central portion so as to be equal in diameter to the central portion, and such convergently tapered portions may be connected to the central portion. This tapered portion prevents the extinguishment of an arc spot caused by the difference in diameter between both longitudinal end portions and the central portion at the positions of the connections.

More preferably, in the target and works disposing step, there is disposed a target dividable into three portions which are both longitudinal end portions and a central portion, and in the film forming step there is performed film formation while adjusting the consuming speed of both longitudinal end portions and that of the central portion in such a manner that the replacement timing of the central portion corresponding to the time point of arrival of the central portion at the consumption limit and the replacement timing of both longitudinal end portions at which the longitudinal end portions having already been replaced prior to the replacement timing of the central portion arrives at the consumption limit, overlap each other. Such overlapping between the replacement timing of the central portion and that of both longitudinal end portions permits simultaneous replacement of the central portion and both longitudinal end portions and facilitates management of the target.

EXAMPLE

Using the apparatus shown in FIG. 1, arc ion plating was performed in a working example of the present invention and also in a comparative example (the related art disclosed in Japanese Patent Laid-Open Publication No. 2004-107750).

The work 2 was cylindrical and having an outside diameter of 90 mm and a length L of 500 mm. The target 3 used in the working example was in the shape of a cylinder having an overall length of 700 mm. Upper and lower targets 31, 32 constituting both end portions were each 130 mm in outside diameter, 50 mm in inside diameter and 150 mm in length, while a central target 33 constituting a central portion was 130 mm in outside diameter, 50 mm in inside diameter and 400 mm in length. A consumption limit corresponded to an outside diameter of 70 mm. The target used in the comparative example was in the shape of a cylinder of 700 mm in overall length and having stepped portions. In the comparative target, both end portions were each 130 mm in outside diameter, 50 mm in inside diameter and 150 mm in length, while a central portion was 104.4 mm in outside diameter, 50 mm in inside diameter and 400 mm in length. A consumption limit corresponded to an outside diameter of 70 mm.

For obtaining a uniform film thickness distribution with film thickness variations of within ±5% substantially throughout the overall length of each work 2, the vertically moving speed of the permanent magnet 5 was set to 50 mm/s in a 50 mm area at each stroke end, while in the other central area it was set to 100 mm/s. That is, the consuming speed of the upper and lower targets 31, 32 (both end portions in the comparative example) was set to a speed twice as high as the consuming speed of the central target 33 (central portion in the comparative example). It is known from experience, including experiments, that generally at this consuming speed ratio there usually is obtained a uniform film thickness distribution over the widest range even with the influence of apparatus size.

In both working and comparative examples, targets composed of Cr were used, $N_2$ gas was introduced as process gas into the vacuum chamber 1, and vacuum arc discharge was performed at an arc current of 1000 A while controlling the flow rate of $N_2$ gas so as to maintain the internal pressure of the vacuum chamber 1 at 3 Pa. By this method a 10 μm thick CrN film was formed for fifteen works 2 per batch.

In the working example of the present invention, the upper and lower targets 31, 32 reached the consumption limit at 108 batches and only those targets 31, 32 having reached the consumption limit were replaced with those not used yet. The formation of CrN film was continued and simultaneously with arrival at the consumption limit of the central target 33 at the next 108 batches the previously replaced upper and lower targets 31, 32 also reached the consumption limit. That is, the whole of the target 3 reached the consumption limit. The results obtained are shown in Table 1 below.

TABLE 1

| | Comparative Example (Related Art) | Example of Present. Invention |
|---|---|---|
| Target Configuration | | The above one set corresponds to two conventional targets (the left figure) |
| Consuming speed ratio (Both end portions:Central portion) | 2:1 | 2:1 |
| Both end portions Outside dia. × Length (mm) | Φ130 × L150 | Φ130 × L150 |
| Central portion Outside dia. × Length (mm) | Φ104.4 (*1) × L400 | Φ130 × L400 |
| Consumption limit Outside dia. (mm) | Φ70 | Φ70 |
| Inside dia. (mm) | Φ50 | Φ50 |
| Amount of target material used (a) (cm3) | 6032 | 11308 |
| Effective consumption quantity (b) (cm3) | Both end portions: 1414 × 2 Central portion: 1885 Total: 4713 (*2) | Both end portions: 1414 × 4 Central portion: 3770 Total: 9426 (For one target, the quantity is equal to that in the comparative example (*2).) |
| Yield of target material (b/a) | 78.1% | 83.3% |

*1 In case of the consumption speed ratio for both end portions:central portion = 2:1, the value was calculated in such a manner that both end portions and central portion arrived at the consumption limit simultaneously [from $(130^2 - 70^2):(X^2 - 70^2) = 2:1$].

As is seen from Table 1, in the working example of the present invention, as compared with the comparative example (the foregoing related art), the amount of the target material used (a) relative to the effective consumption quantity (b) of the target was small and it is possible to improve the yield of the target material. Besides, in HIP treatment during manufacture of the target, a sectional shape dimension orthogonal to the target longitudinal direction may be the same throughout the overall target length, so that it is possible to reduce the manufacturing cost of the target 3 and hence reduce the cost of the resulting film-formed product.

The invention claimed is:

1. An arc ion plating method for forming a film on a surface of a work with use of a target, comprising the steps of:

disposing within a vacuum chamber a target and a work, the target being longitudinally divided into separate elements corresponding to at least a central portion and longitudinal end portions at both longitudinal ends of said central portion, wherein the separate elements are individually and separately replaceable, and the dimensional shape of the target, as seen in a section through the target in a direction orthogonal to the target longitudinal direction, is substantially equal throughout the overall length of the target;

a film forming step of evaporating and ionizing a constituent material of the target by vacuum arc discharge using the target as a cathode, and conducting target material ions resulting from the ionization to the work, thereby causing a film to be formed on the work, wherein in the film forming step, the position of an arc spot on a surface of the target is controlled in such a manner that the consuming speed of the longitudinal end portions becomes higher than the consuming speed of the central portion, whereby at least one of the longitudinal end portions will reach a consumption limit of the respective longitudinal end portion before the target central portion reaches a consumption limit of the target central portion; and upon arrival of the at least one of the longitudinal end portions at the consumption limit of the respective longitudinal end portion before the target central portion reaches a consumption limit of the target central portion, a step of replacing only the respective longitudinal end portion that has reached the consumption limit with a replacement end portion, and thereafter continuing the film forming step, wherein the replacement end portion is convergently tapered so as to be substantially equal in diameter to the central portion of the target at the position of the connection of the replacement end portion with the central portion of the target, the taper being such that the diameter of the tapered replacement end portion becomes larger with increased distance from the central portion, and wherein when replacing only the longitudinal end portion of the target that has reached a consumption limit, the convergently tapered portion is connected to the central portion.

2. An arc ion plating method according to claim 1, wherein in the target and work disposing step the work and a target having a longitudinal dimension almost equal to the longitudinal dimension of the work are opposed to each other in an attitude such that the longitudinal dimension of the work and that of the target become substantially parallel to each other.

3. An arc ion plating method according to claim 1, wherein the timing when the central portion has reached the consumption limit thereof, and the timing when the replacement end portion has reached the consumption limit thereof, occur substantially simultaneously.

* * * * *